(12) United States Patent
Furukawa et al.

(10) Patent No.: US 6,255,158 B1
(45) Date of Patent: Jul. 3, 2001

(54) PROCESS OF MANUFACTURING A VERTICAL DYNAMIC RANDOM ACCESS MEMORY DEVICE

(75) Inventors: Toshiharu Furukawa, Essex Junction, VT (US); Ulrike Gruening, Wappingers Falls, NY (US); David V. Horak, Essex Junction, VT (US); Jack A. Mandelman, Stormville, NY (US); Carl J. Radens, LaGrangeville, NY (US); Thomas S. Rupp, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/667,652

(22) Filed: Sep. 22, 2000

Related U.S. Application Data

(62) Division of application No. 09/374,687, filed on Aug. 16, 1999, now Pat. No. 6,153,902.

(51) Int. Cl.[7] .............................................. H01L 21/8242
(52) U.S. Cl. ............................................. 438/243; 438/244
(58) Field of Search ..................................... 438/243–249, 438/386–392

(56) References Cited

U.S. PATENT DOCUMENTS

| 4,890,144 | 12/1989 | Teng et al. . |
| 5,001,526 | 3/1991 | Gotou . |
| 5,097,381 | 3/1992 | Vo . |
| 5,155,059 | 10/1992 | Hieda . |
| 5,177,576 | 1/1993 | Kimura et al. . |
| 5,307,310 | 4/1994 | Narita . |
| 5,317,177 | 5/1994 | Nagata et al. . |
| 5,378,907 | 1/1995 | Melzner . |
| 5,502,320 | 3/1996 | Yamada . |
| 5,528,062 | 6/1996 | Hsieh et al. . |
| 5,547,889 | 8/1996 | Kim . |
| 5,555,520 | 9/1996 | Sudo et al. . |
| 5,574,299 | 11/1996 | Kim . |
| 5,612,559 | 3/1997 | Park et al. . |
| 5,674,769 | 10/1997 | Alsmeier et al. . |
| 5,723,889 | 3/1998 | Choi et al. . |
| 6,034,389 | 3/2000 | Buirs, Jr. et al. . |
| 6,184,107 | * | 2/2001 | Divakaruni et al. ................. 438/270 |

FOREIGN PATENT DOCUMENTS 60-176265  *  10/1985  (JP) .

* cited by examiner

Primary Examiner—Jey Tsai
(74) Attorney, Agent, or Firm—Ratner & Prestia; Todd M. C. Li, Pat. Agent

(57) ABSTRACT

A dynamic random access memory (DRAM) device. The DRAM device is formed in a substrate having a top surface and a trench with a sidewall formed in the substrate. A signal storage node is formed using a bottom portion of the trench and a signal transfer device is formed using an upper portion of the trench. The signal transfer device includes a first diffusion region coupled to the signal storage node and extending from the sidewall of the trench into the substrate a second diffusion region formed in the substrate adjacent to the top surface of the substrate and adjacent the sidewall of the trench, a channel region extending along the sidewall of the trench between the first diffusion region and the second diffusion region, a gate insulator formed along the sidewall of the trench extending from the first diffusion region to the second diffusion region, a gate conductor filling the trench and having a top surface, and a wordline having a bottom adjacent the top surface of the gate conductor and a side aligned with the sidewall of the trench.

5 Claims, 20 Drawing Sheets

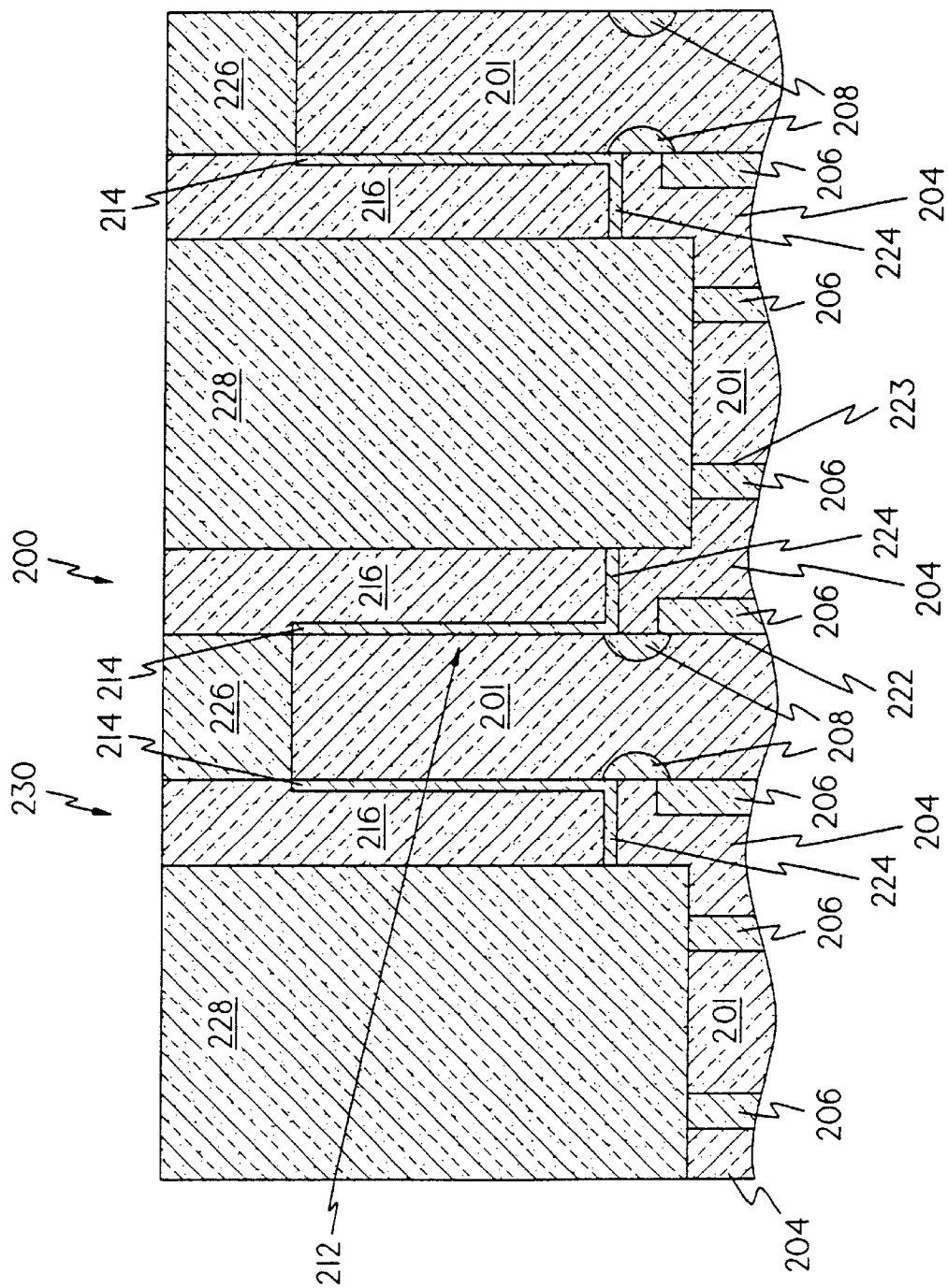

PROCESS OF MANUFACTURING A VERTICAL DYNAMIC RANDOM ACCESS MEMORY DEVICE

This application is a divisional of U.S. patent application Ser. No. 09/374,687, filed on Aug. 16, 1999, U.S. Pat. No. 6,153,902.

TECHNICAL FIELD

The present invention relates generally to a dynamic random access memory (DRAM) device and, more particularly, to a vertical DRAM device having a wordline self-aligned to a storage trench.

BACKGROUND OF THE INVENTION

In the semiconductor industry, there is an ever-increasing desire to increase memory density and performance. These goals are often achieved by scaling dynamic random access memory (DRAW devices to smaller dimensions and operating voltages.

Vertical DRAM devices use a trench to form both a signal storage node and a signal transfer device. Vertical DRAM devices have been proposed to increase memory density because they decouple the length of the vertical signal transfer device channel from the minimum feature size. This configuration allows longer channel lengths without a proportional decrease in memory density. Channel length may then be properly scaled relative to gate oxide thickness and relative to junction depth to reduce channel doping, minimize junction leakage, and increase retention times.

FIG. 1 shows a partial cross-sectional view of a vertical DRAM device or cell 100 formed in a substrate 101 (typically P-silicon). The DRAM cell 100 is formed using a trench (DT or deep trench) having a sidewall 122. The DRAM cell 100 includes a signal storage node (partially shown) 102 which includes a storage node conductor 104 (typically N+ polysilicon) and a collar oxide 106. The signal transfer device of the DRAM cell 100 includes a first diffusion region 108, a second diffusion region 110(typically N+ silicon), a channel region 112, a gate insulator 114, and a gate conductor 116 (typically N+ polysilicon).

The gate conductor 116 is coupled to the wordline 118. The wordline 118 comprises an N+ polysilicon lower layer 118A, a WSi$_x$ middle layer 118B, and a nitride layer 118C. The second diffusion region 110 is covered by a nitride layer 120. The storage node conductor 104 is covered by a trench-top oxide (TTO) 123. A shallow trench isolation (STI) region 128 is formed to provide isolation for DRAM device 100.

The trench sidewall 122 of the DRAM cell 100 is a distance W from the sidewall 124 of the trench of an adjacent DRAM cell. For DRAM cells 100 occupying a 5F$^2$ surface area of the substrate 101, where F is the minimum feature size, the distance W between adjacent trench sidewalls may be 2F. With a trench-to-trench distance W of 2F, a wordline 118 can overlap past the sidewall 122 of the trench by a distance of 0.5F. This configuration allows adequate overlap of the gate conductor 116 by wordline 118 even in the worst case of misalignment when DT and wordline bias are under control. DRAM cell density on a wafer may be increased by decreasing the trench-to-trench spacing W. As trench-to-trench spacing W is reduced below 2F, the probability that the wordline conductor will not overlap the trench edge increases because the layed out overlap of the wordline to the trench is reduced below 0.5F while the alignment tolerance remains constant.

DRAM cell 100 in FIG. 1 has a wordline 118 which does not completely overlap the trench sidewall 122. This incomplete overlap causes the etch used to form the wordline 118 to cut into the underlying gate conductor 116 as illustrated by the gate conductor over-etch 105. Over-etch 105 may result in damage to the gate insulator 114 and a failure of the gate conductor 116 to overlap the second diffusion region 110.

To overcome the shortcomings of conventional DRAM devices, a new vertical DRAM device is provided. An object of the present invention is to provide a vertical DRAM device that has a wordline conductor self-aligned to the sidewall of the trench. A related object is to provide a process of manufacturing such a vertical DRAM device. Another object is to provide a pair of vertical DRAM devices each having a respective wordline and each formed using a respective trench in which the distance between the respective trenches equals the distance between respective wordlines. It is still another object to provide a vertical DRAM device having a wordline positioned above the surface of the substrate.

SUMMARY OF THE INVENTION

To achieve these and other objects, and in view of its purposes, the present invention provides a dynamic random access memory device formed in a substrate. The substrate has a top surface and has a trench having a sidewall formed in the substrate. A signal storage node is formed using a bottom portion of the trench and a signal transfer device is formed using an upper portion of the trench. The signal transfer device includes a first diffusion region coupled to the signal storage node and extending from the sidewall of the trench into the substrate, a second diffusion region formed in the substrate adjacent to the top surface of the substrate and adjacent to the sidewall of the trench, a channel region extending along the sidewall of the trench between the first diffusion region and the second diffusion region, a gate insulator formed along the sidewall of the trench extending from the first diffusion region to the second diffusion region, a gate conductor filling the trench and having a top surface, and a wordline having a bottom adjacent the top surface of the gate conductor and a side aligned with the sidewall of the trench.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures:

FIGS. 2 through 8 illustrate a process of manufacturing a DRAM cell according to an exemplary embodiment of the present invention and, more specifically, FIG. 2 is a partial cross-sectional view of a wafer having several DRAM cells after deep trench processing as known to those skilled in the art;

FIG. 4 illustrates the step of depositing and patterning a photoresist;

FIG. 5 is a partial cross-sectional view of the array region following the step of etching the exposed oxide in the STI regions selective to the pad nitride layer, the polysilicon gate conductor, and the photoresist;

FIG. 6 is a partial cross-sectional view of the array region following the step of stripping the photoresist and isotropically etching the exposed polysilicon gate conductor selective to the oxide STI region and the pad nitride layer;

FIG. 7 is a partial cross-sectional view of the array region after a wordline is deposited, planarized, and recessed below the surface of the pad nitride layer;

FIG. 8 is a partial cross-sectional view of the array region after the pad nitride layer is removed selective to the oxide of the STI region and the oxide layer, a screen oxide layer is grown, array region p-well implants are performed, and an N+ dopant is implanted to form the second diffusion region.

DETAILED DESCRIPTION OF THE INVENTION

Figure 1:
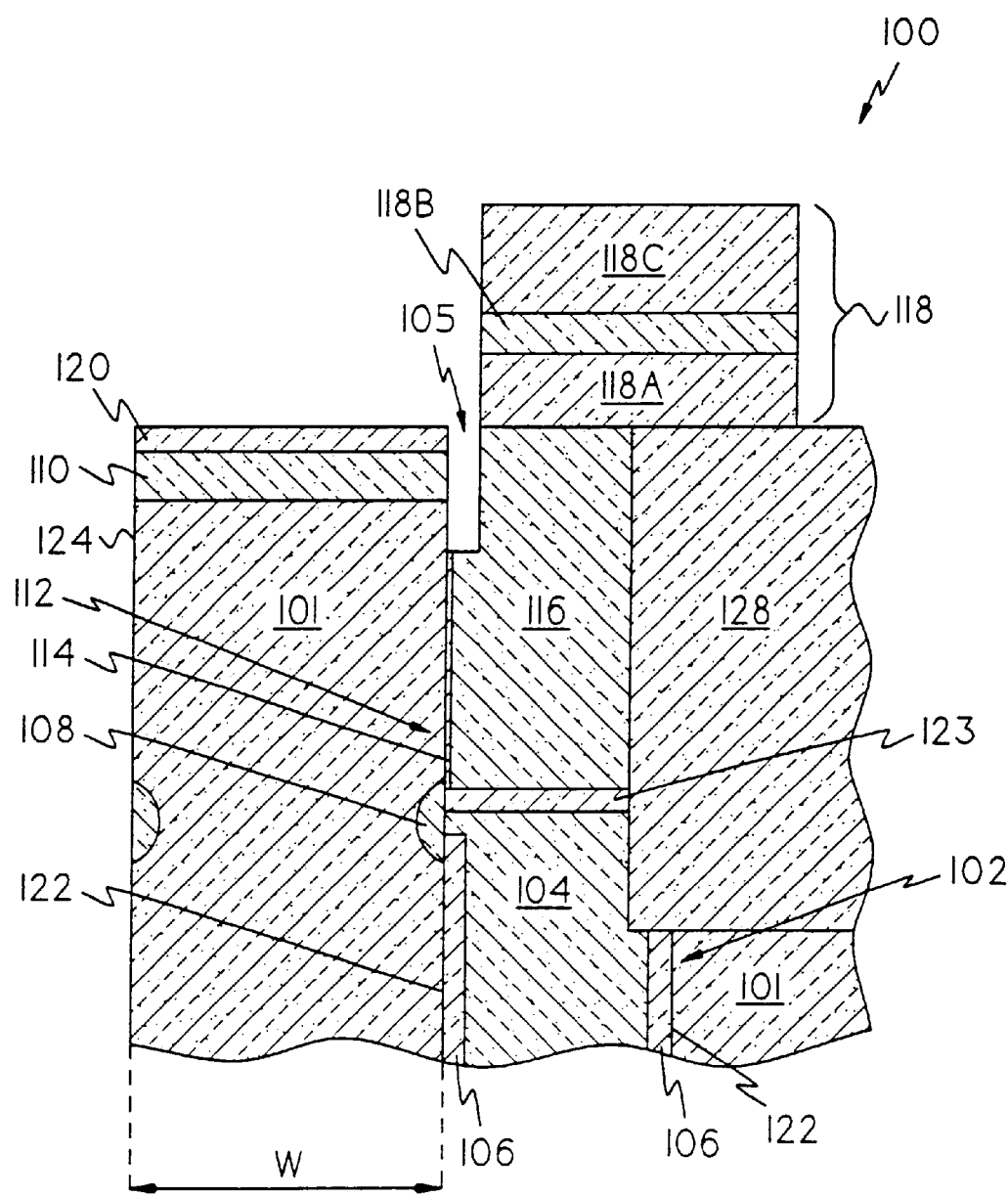
FIG. 1 is a partial cross-sectional view of a DRAM cell having a wordline that does not completely overlap the trench sidewall.
Figure 2:
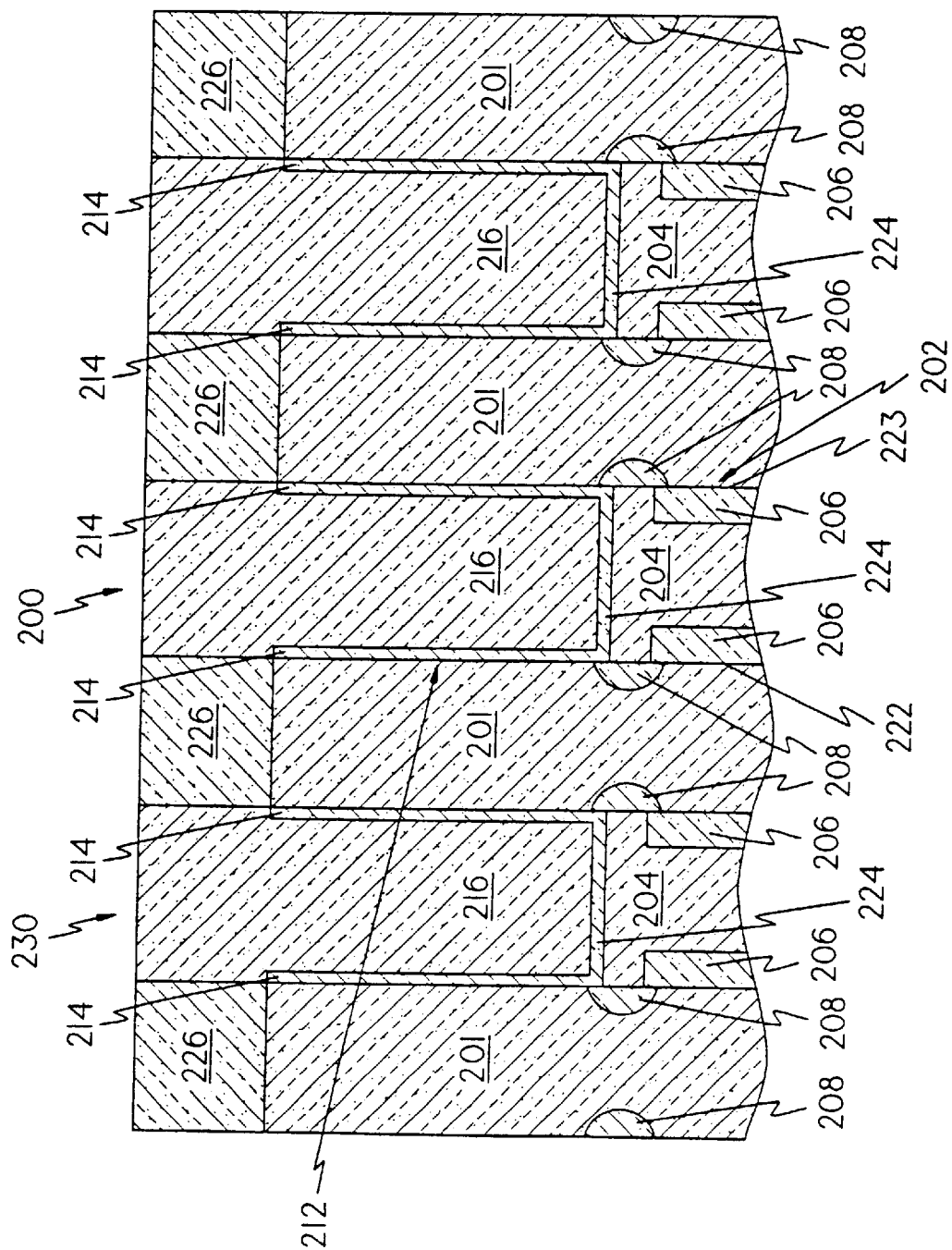

Referring now to the drawing, in which like reference numbers refer to like elements throughout, an exemplary process of manufacturing a vertical DRAM device according to the present invention is described with reference to FIGS. 2 through 8. FIG. 2 is a partial cross-sectional view of a wafer after deep trench processing as known to those skilled in the art. A nitride layer 226 is formed upon a substrate 201 such as P-silicon, for example, before the deep trench processing. In an exemplary embodiment, a thin thermal oxide (not shown) may be formed on the surface of the substrate 201 before forming the nitride layer 226. The thin thermal oxide may reduce defects in the substrate 201. In an exemplary embodiment, before etching the deep trenches, an oxide layer (not shown) may be formed over the nitride layer 226 to serve as a hard etch mask.

Each vertical DRAM device 200, 230 is formed in the substrate 201 using a trench (DT or deep trench) having sidewalls 222, 223. The DRAM cell 200 includes a signal storage node (partially shown) 202 which includes a storage node conductor 204 and a collar oxide 206. The signal transfer device of the DRAM cell 200 includes a first diffusion region 208, a channel region 212, a gate insulator 214, and a gate conductor 216 (typically polysilicon).

The storage node conductor 204 is isolated from the gate conductor 216 by a trench-top oxide (TTO) 224. In an exemplary embodiment of the present invention, the trench-top oxide 224 has a thickness greater than the thickness of the gate insulator 214. The TTO 224 may be formed thicker by thermally growing an oxide layer that will grow thicker on the storage node conductor 204, which is comprised of N+ polysilicon in this exemplary embodiment, than on the substrate 201, which is P-silicon in this embodiment. Alternatively, the TTO 224 may be formed by high density plasma (HDP) silicon dioxide deposition. The gate conductor 216 is then deposited and planarized to the surface of the pad nitride layer 226. In an exemplary embodiment, the gate conductor 216 comprises heavily doped polysilicon.

Figure 2A:
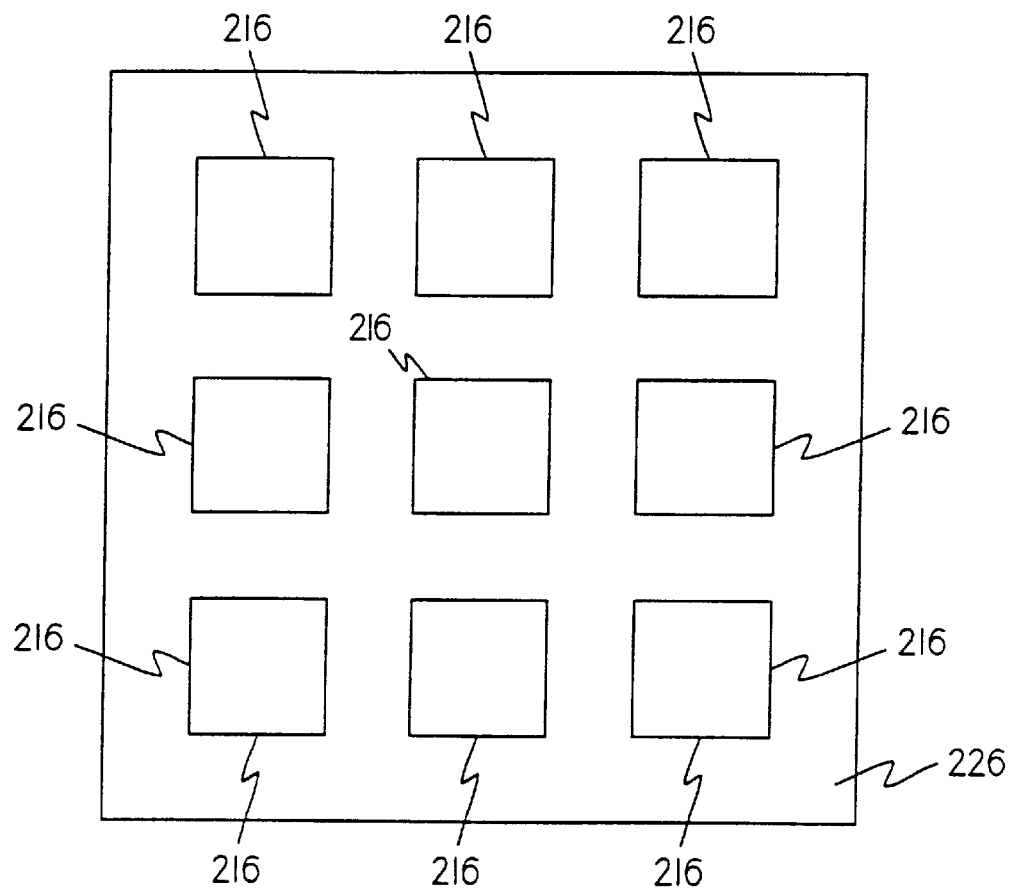
FIG. 2A is a top view of an array of DRAM cells, as shown in FIG. 2, according to an exemplary layout.
Figure 2B:
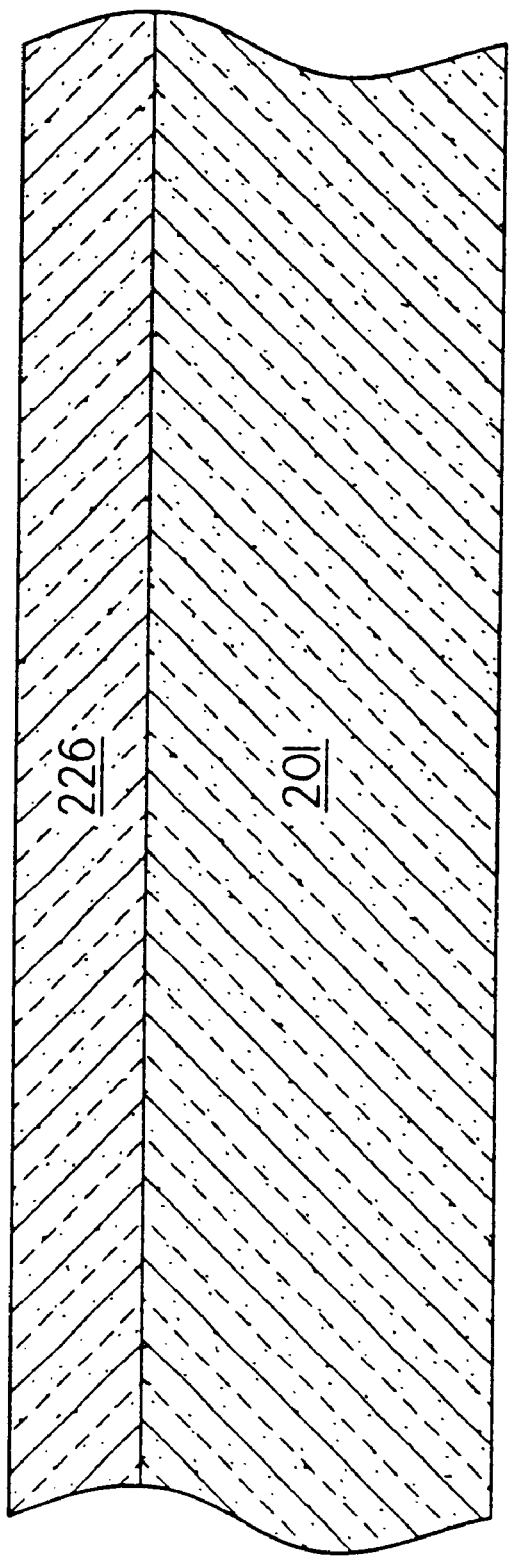
FIG. 2B is a partial cross-sectional view of support circuitry at a stage in processing corresponding to FIG. 2.

FIG. 2A is a top view of an array of DRAM devices 200 shown in FIG. 2 according to an exemplary layout. A wafer may include both an array region in which DRAM devices 200 are formed and a support region in which support circuitry is formed. FIG. 2B is a partial cross-sectional view of support circuitry at a stage in processing corresponding to FIG. 2.

As shown in FIG. 3, shallow trench isolation (STI) regions 228 are formed to provide isolation between adjacent devices 200, 230. In the exemplary embodiment shown in FIG. 3, the STI regions 228 are formed by first patterning the wafer and then etching an STI trench to a level below the first diffusion region 208 to provide sufficient isolation between the first diffusion regions 208 of adjacent devices 200, 230. The oxide used to form STI regions 228 is then deposited and planarized to the surface of the pad nitride 226. In an exemplary embodiment, high density plasma (HDP) oxide deposition is used to fill the high aspect ratio STI trench.

Figure 3A:
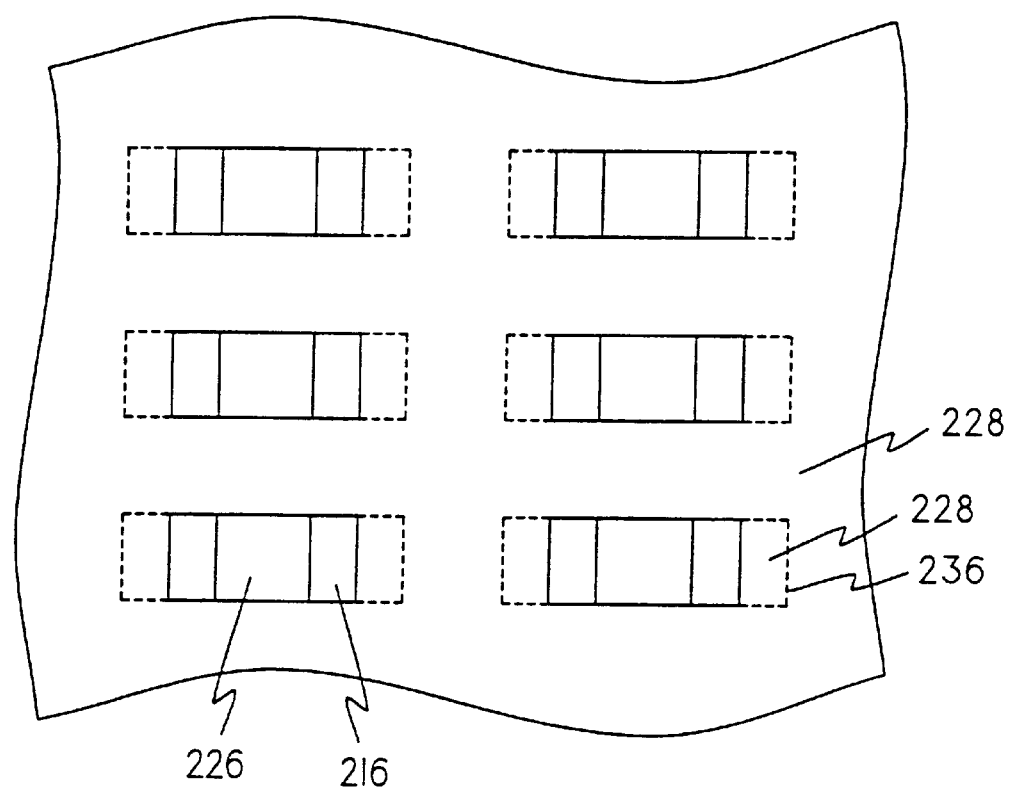
FIG. 3A is a top view of an array of the DRAM devices shown in FIG. 3 according to an exemplary layout.
Figure 3B:
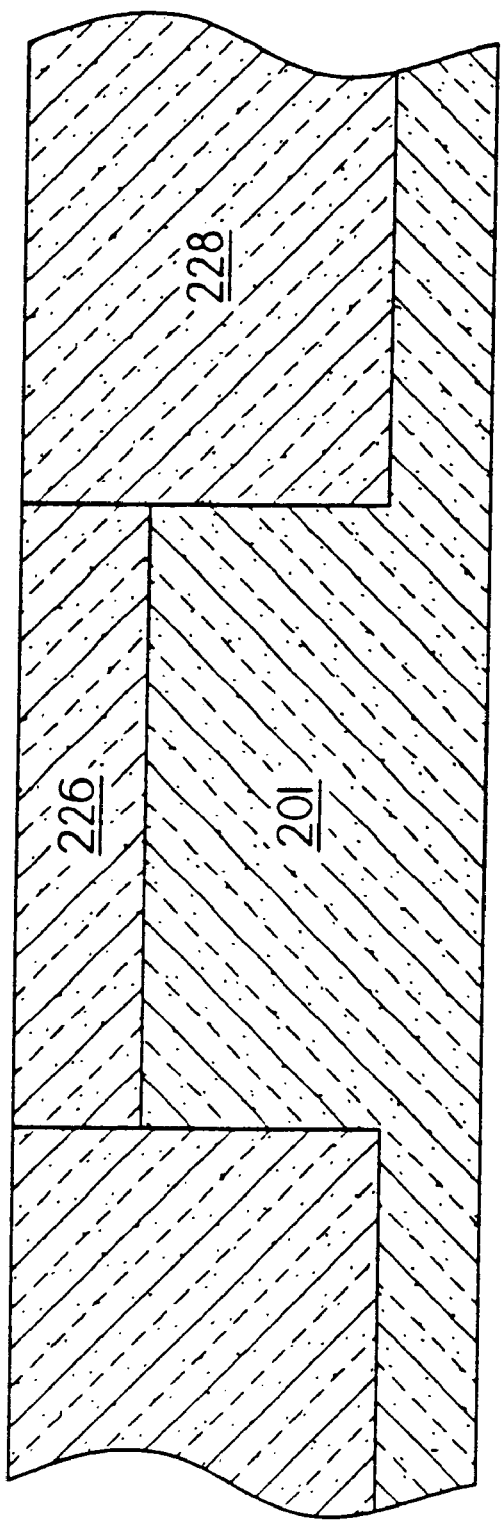
FIG. 3B is a partial cross-sectional view of support circuitry at a stage in processing corresponding to FIG. 3 illustrating that the shallow trench isolation (STI) regions are also formed in the support regions of the wafer.

FIG. 3A is a top view of an array of the DRAM devices shown in FIG. 3 according to an exemplary layout. The dashed lines illustrate the boundary 236 of the deep trenches cut off by the STI region 228. FIG. 3B is a partial cross-sectional view of support circuitry at a stage in processing corresponding to FIG. 3 illustrating that STI regions 228 are also formed in the support regions of the wafer.

Figure 3C:
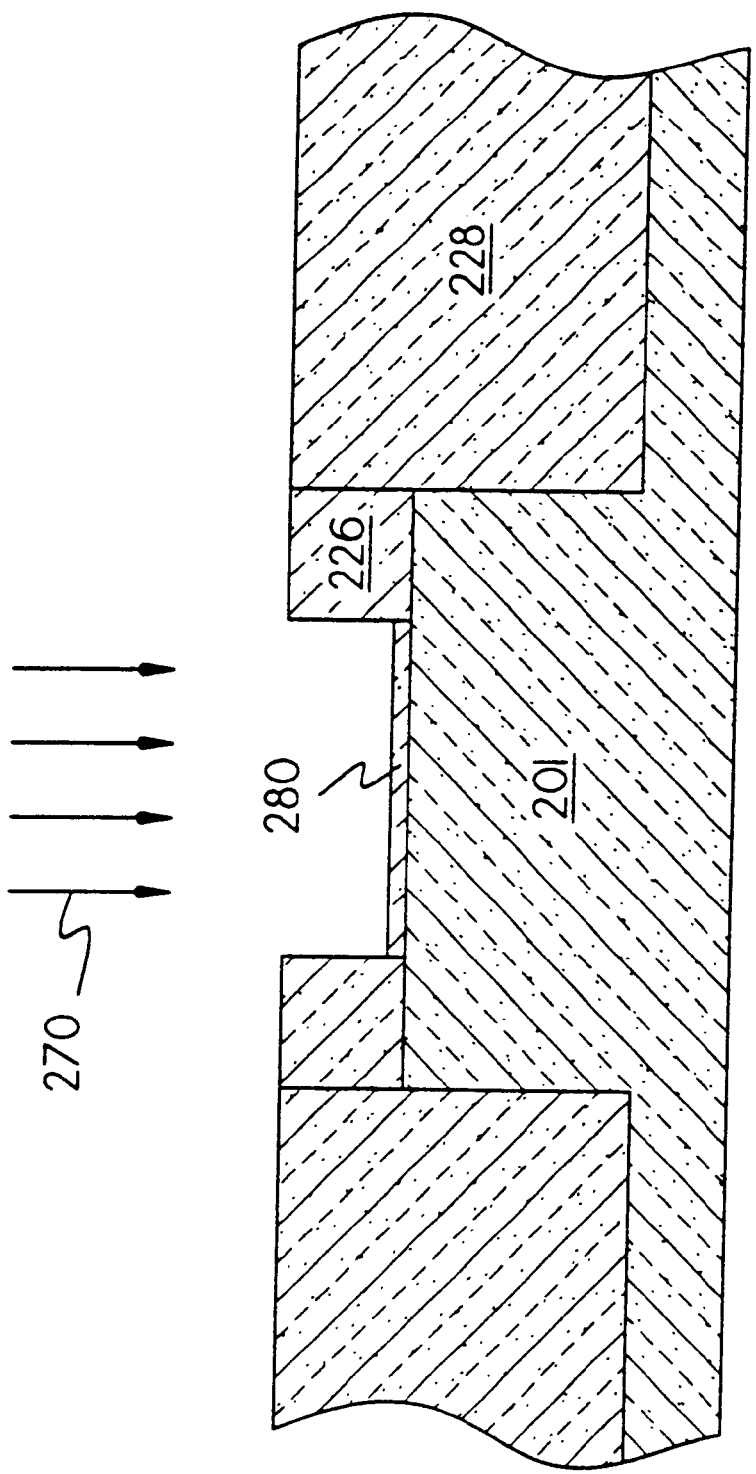
FIG. 3C shows a pad nitride layer in the support regions (the pad nitride layer having been patterned and etched down to the substrate to define active area regions), a sacrificial oxide having been grown on the exposed substrate, and the performance of well implants.

As shown in FIG. 3C, the pad nitride layer 226 in the support regions is then patterned and etched down to the substrate 201 to define active area regions. A sacrificial oxide 280 is then grown on the exposed substrate 201. Well implants (represented by arrows 270) are next performed.

Figure 3D:
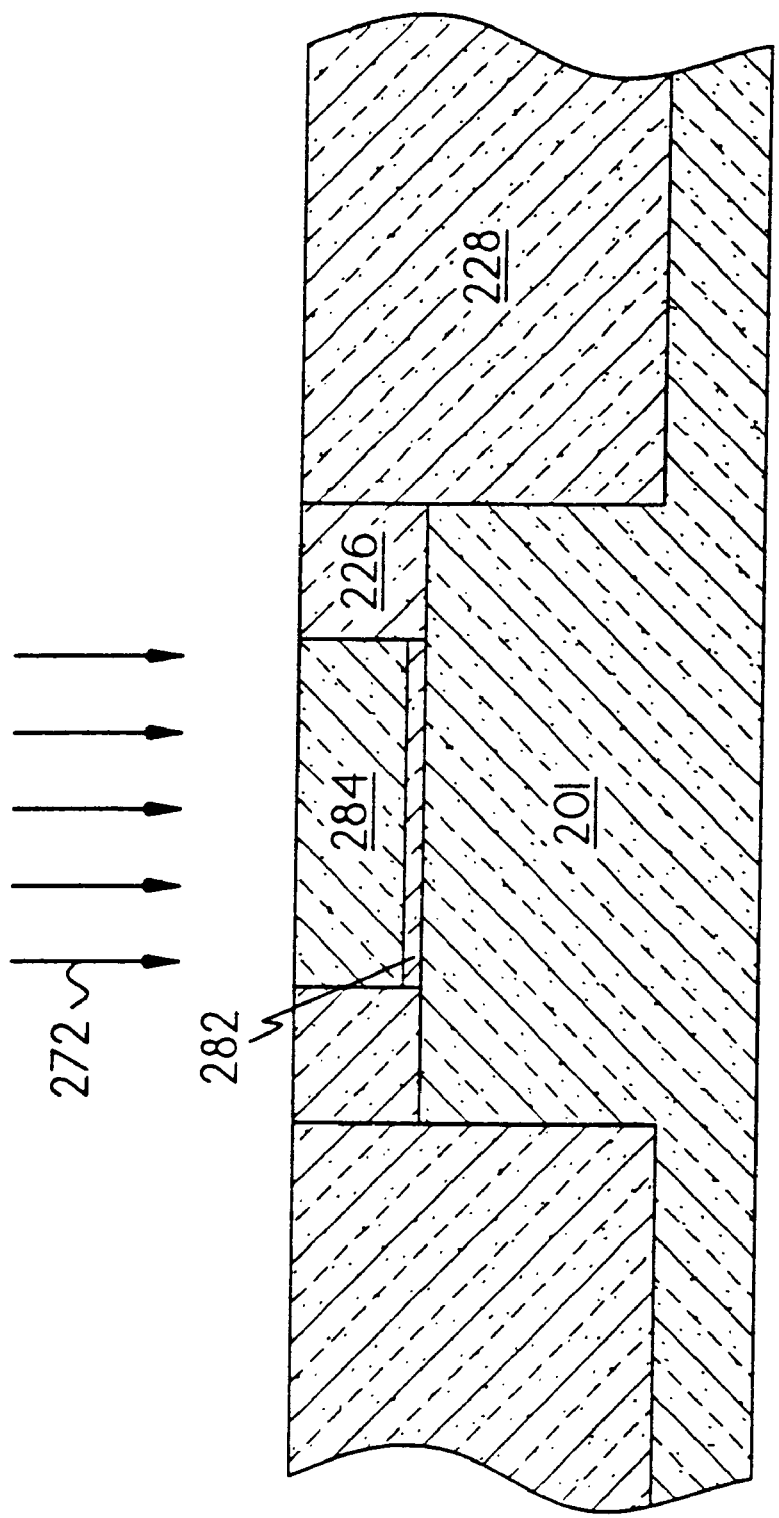
FIG. 3D shows the support circuitry of FIG. 3C after the sacrificial oxide is removed, an oxide gate insulator layer is formed, a layer of polysilicon is deposited and polished to the surface of the nitride pad layer to form a gate conductor, and gate conductor implants are performed into the gate conductor to establish the doping of the gate conductor.

As shown in FIG. 3D, the sacrificial oxide 280 is removed and a gate insulator layer 282 is formed. A layer of polysilicon is then deposited and polished to the surface of the nitride pad layer 226 to form a gate conductor 284. This polishing step removes from the array region excess polysilicon and oxide which were formed during support region processing. Gate conductor implants (represented by arrows 272) are then performed into the gate conductor 284 to establish the doping of the gate conductor 284.

Figure 4:
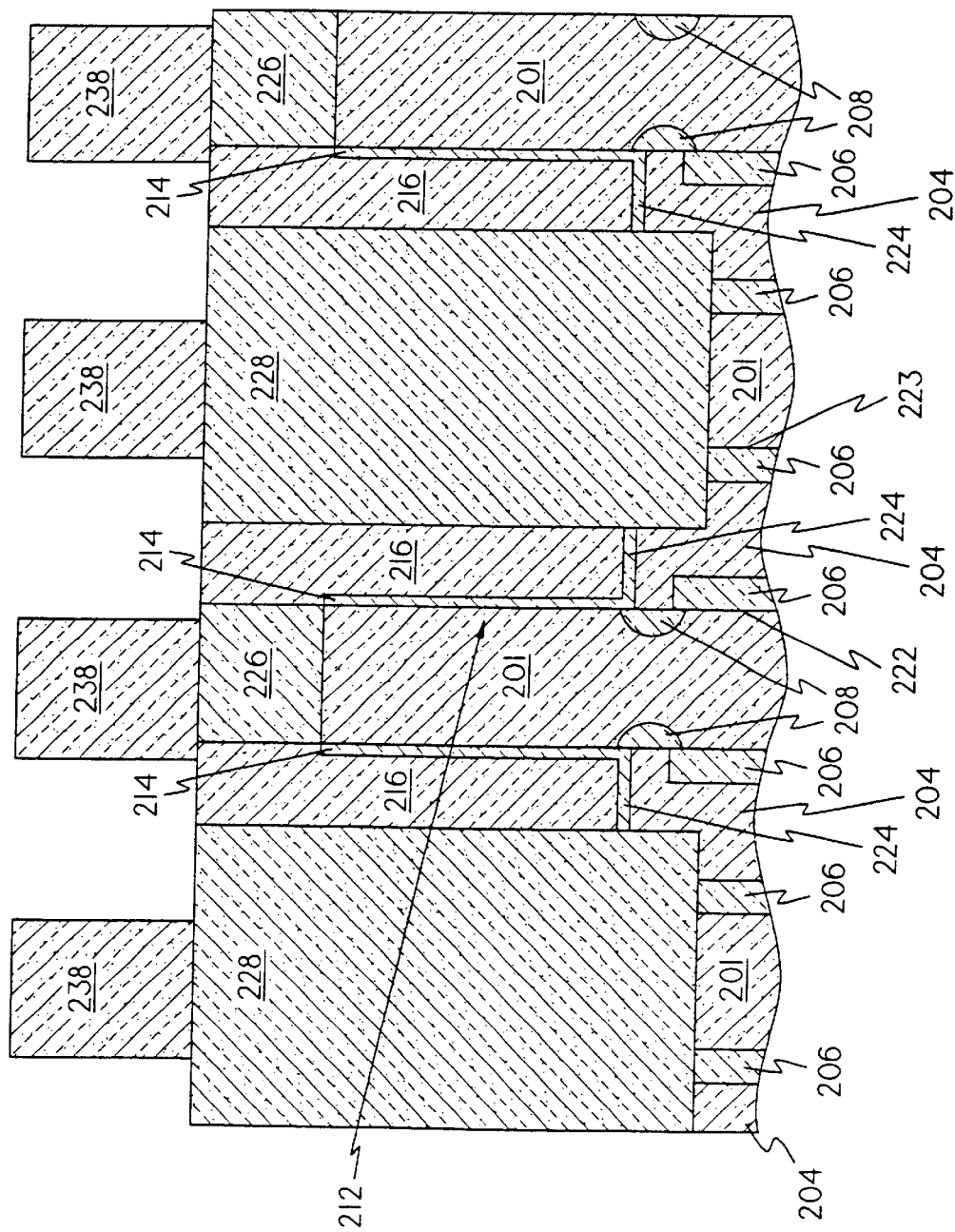
Figure 4A:
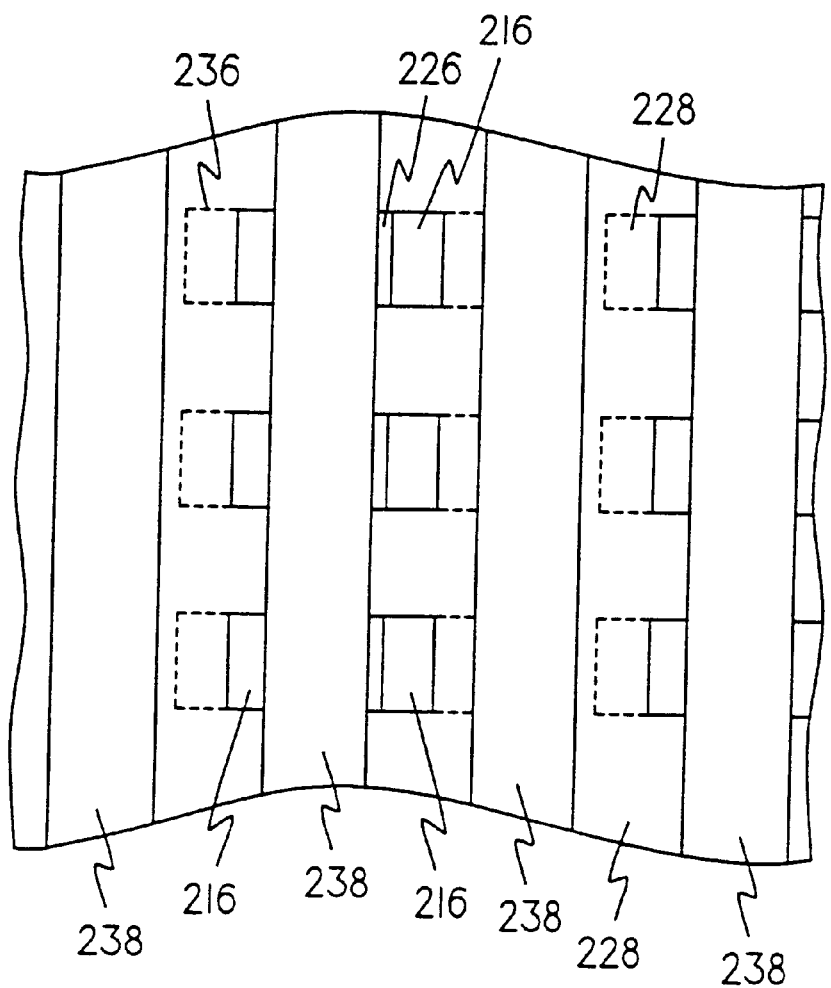
FIG. 4A is a top view of the DRAM devices shown in FIG. 4.
Figure 4B:
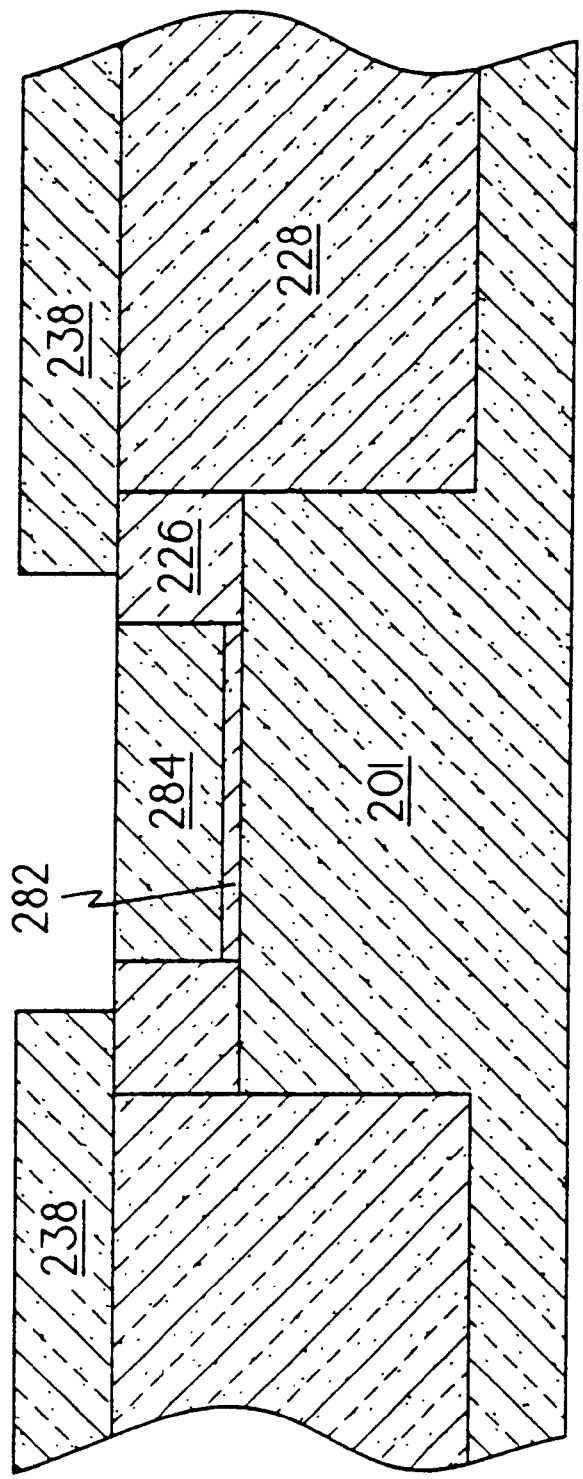
FIG. 4B is a partial cross-sectional view of support circuitry at a stage in processing corresponding to FIG. 4.

A photoresist 238 is then deposited upon the wafer and patterned as shown in FIG. 4. The photoresist 238 is intentionally misaligned with the deep trenches in this exemplary embodiment to illustrate that wordlines (formed later) will be aligned to the deep trenches regardless of the alignment of the pattern of the photoresist 238. FIG. 4A is a top view of the DRAM devices shown in FIG. 4. FIG. 4B is a partial cross-sectional view of support circuitry at a stage in processing corresponding to FIG. 4.

Figure 5:
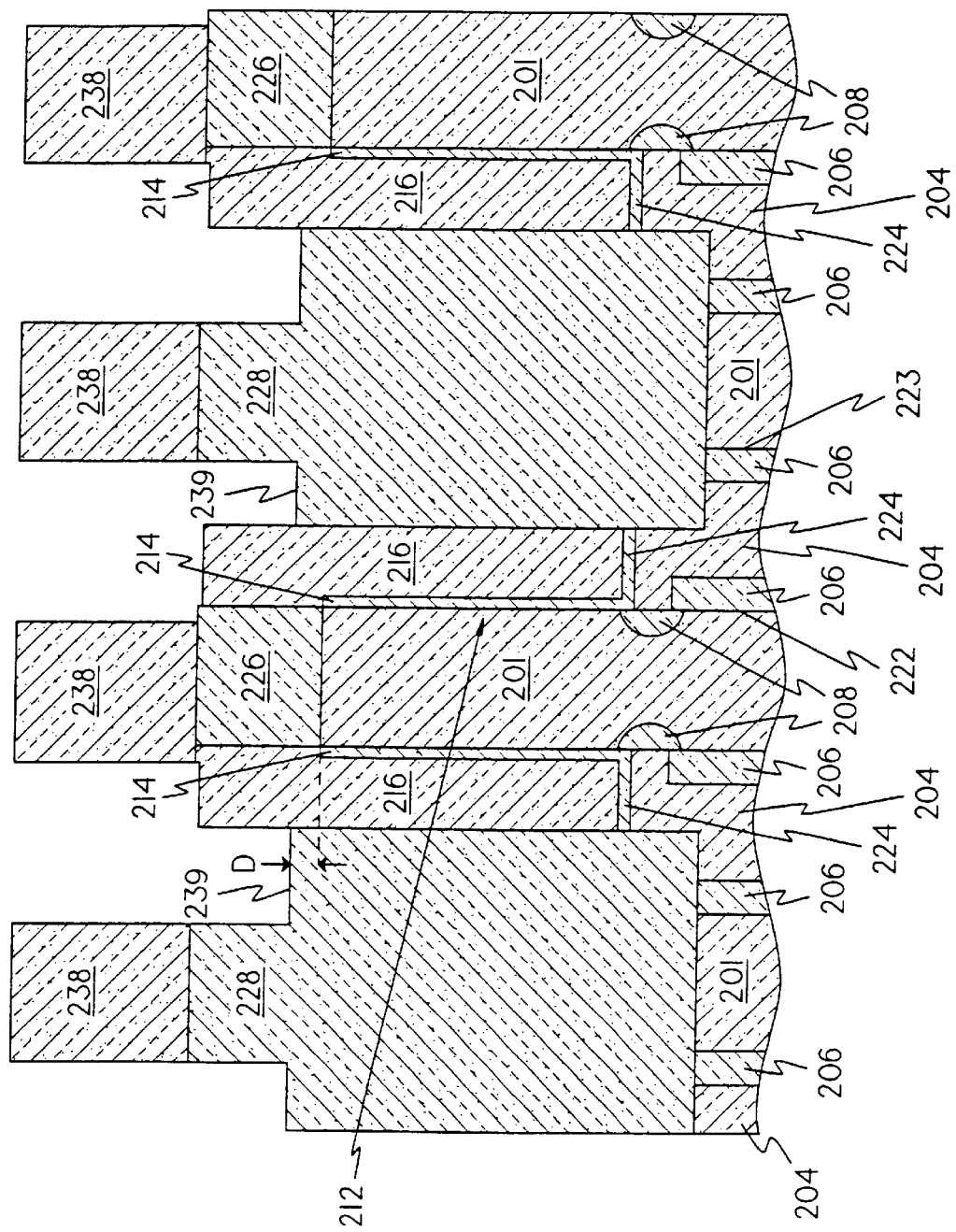

As shown in FIG. 5, the exposed oxide in the STI regions 228 is etched selective to pad nitride layer 226, polysilicon gate conductor 216, and photoresist 238. In an exemplary embodiment of the present invention, the exposed oxide is etched using reactive ion etching (RIE). In an exemplary embodiment of the present invention, the bottom 239 of the etched oxide is above the top surface of the substrate 201 as illustrated by distance D. This configuration helps to avoid shorts between the gate conductor 216 and the substrate 201.

The oxide etch may result in a small amount of the gate conductor 216 being removed without adverse consequences. A wordline-to-substrate 201 short may occur if the gate conductor 216 is etched to a level below the surface of the substrate 201. The wordline-to-substrate 201 short may be avoided by adding spacers (not shown) on the exposed sidewalls of the substrate 201 before depositing the wordline conductor.

Figure 6:
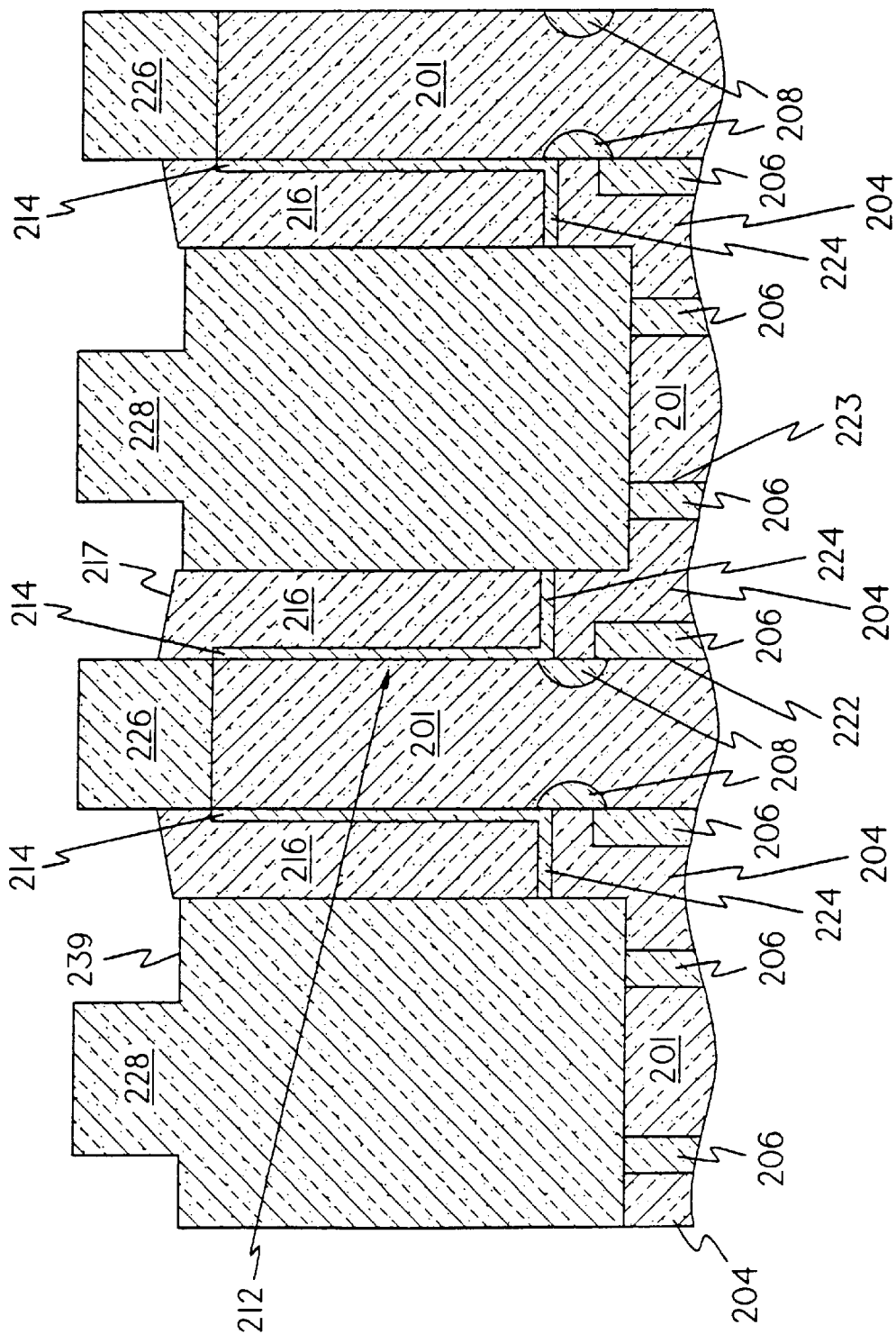

As shown in FIG. 6, the photoresist 238 is then stripped and the exposed polysilicon gate conductor 216 is isotropically etched selective to oxide STI region 228 and pad nitride layer 226. This etch forms a damascened channel for a wordline conductor including the union of the opening formed in the STI region 228 and the opening formed in the gate conductor 216. In the exemplary embodiment shown in FIG. 6, the polysilicon gate conductor 216 is etched to a level above the top surface of the silicon substrate 201. In an exemplary embodiment and as shown in FIG. 6, the isotropic etch of the polysilicon gate conductor 216 may result in a top surface 217 of the polysilicon gate conductor 216 which is tapered so that the top surface 217 is slightly higher towards the gate insulator 214. This taper helps to protect the gate insulator 214 from damage caused by the etch.

Figure 6A:
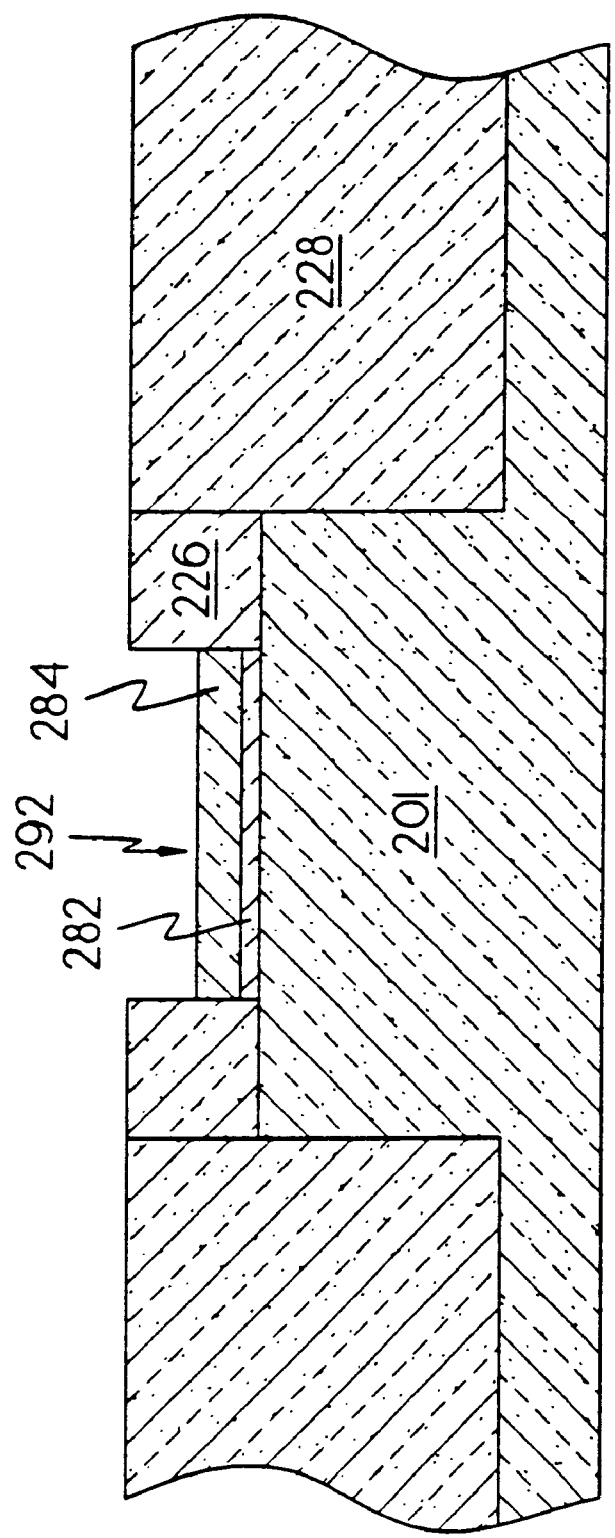
FIG. 6A is a partial cross-sectional view of support circuitry at a stage in processing corresponding to FIG. 6.

FIG. 6A is a partial cross-sectional view of support circuitry at a stage in processing corresponding to FIG. 6. As shown in FIG. 6A, the isotropic etch described with regard to FIG. 6 recesses the gate conductor 284 to form a channel 292 for gate conductor wiring.

Figure 7:
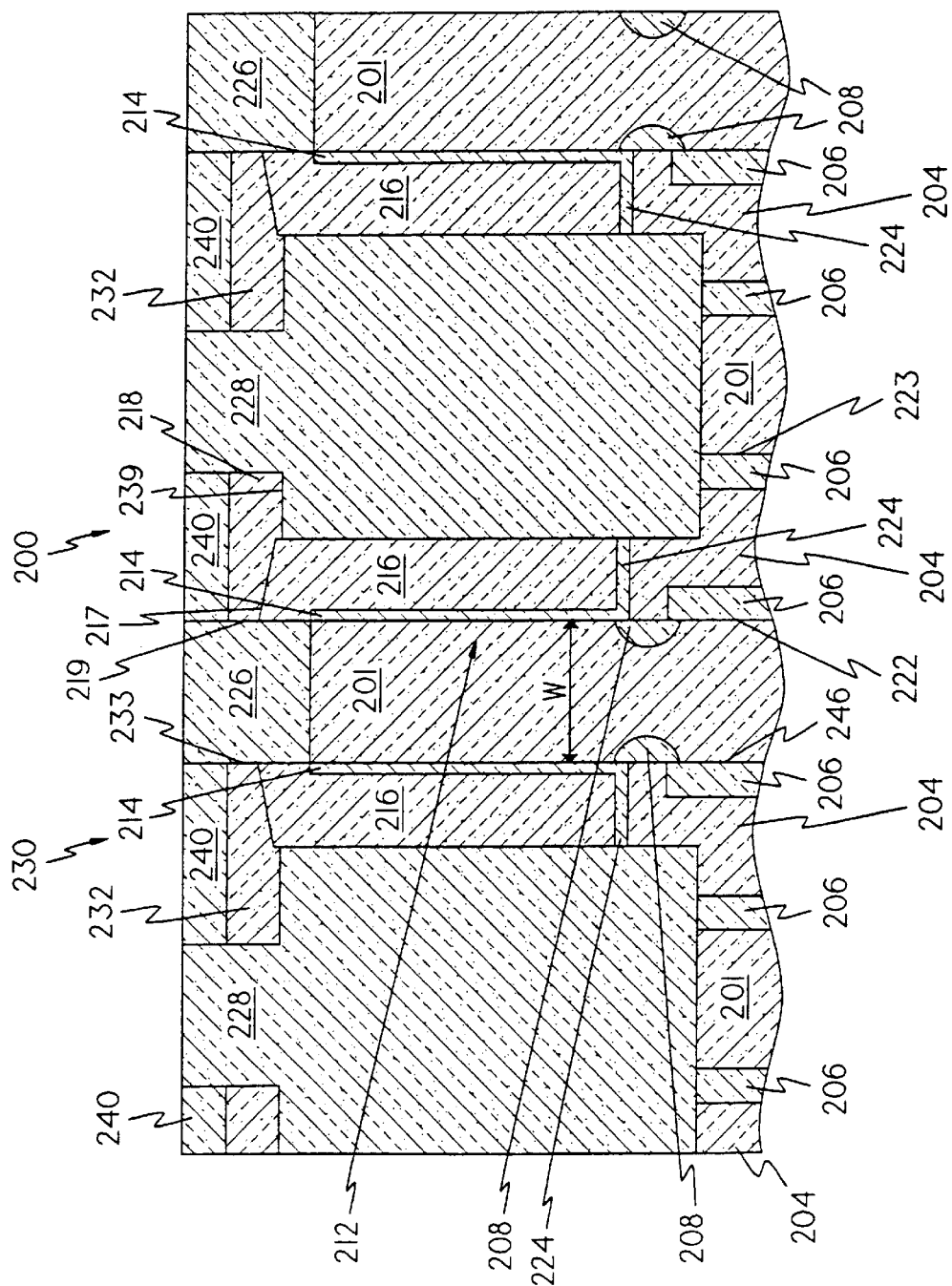
Figure 7A:
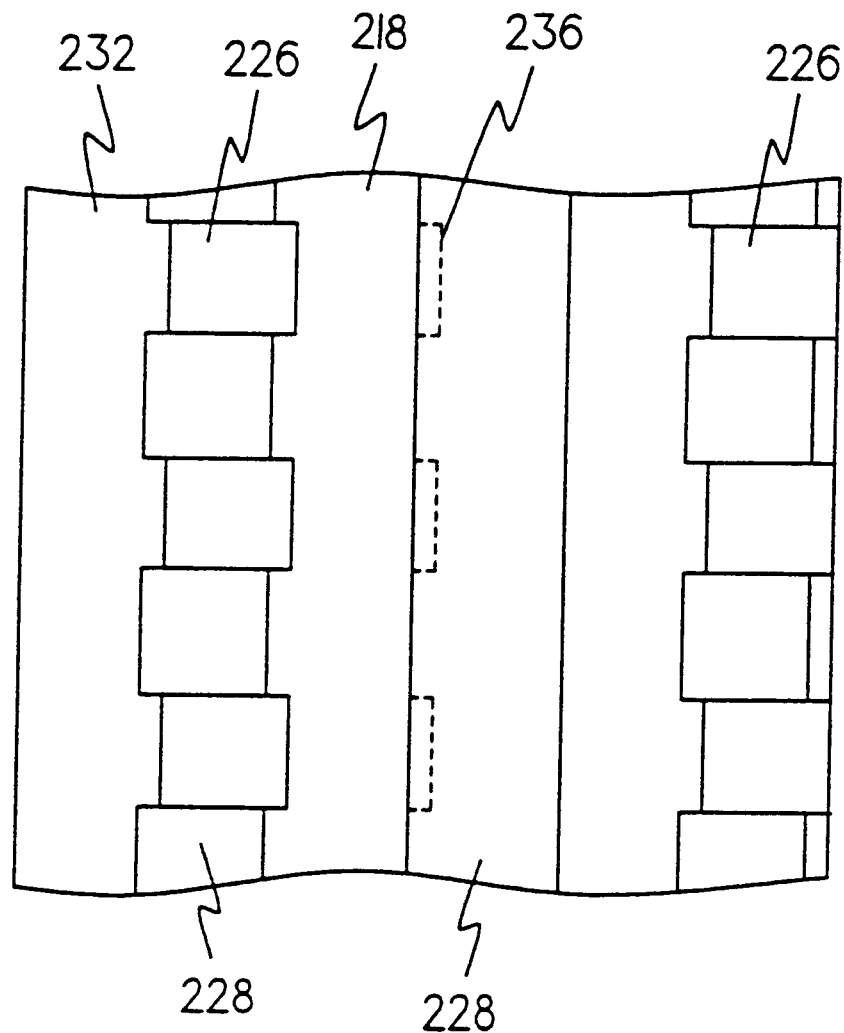
FIG. 7A is a top view of the device shown in FIG. 7 after the wordline has been deposited.

As shown in FIG. 7, a wordline conductor 218, 232 is then deposited, planarized, and recessed below the surface of the pad nitride layer 226. FIG. 7A is a top view of the device shown in FIG. 7 after the wordline 218, 232 has been deposited. FIG. 7A illustrates that the wordline conductor 218 of DRAM device 200 is aligned with the sidewall 222 of the deep trench and the wordline conductor 232 of DRAM device 230 is aligned with the sidewall 246 despite misalignment of the wordline mask photoresist 238 (see FIG. 4). Positioning the wordline conductor 218 in alignment with the sidewall 222 of the deep trench and above the top surface of the substrate 201 provides a processing advantage by eliminating the need for a protection spacer to prevent a short between the wordline conductor 218 and the substrate 201.

In the exemplary embodiment shown in FIG. 7, the wordline conductor 218 comprises tungsten silicide. The material of wordline conductor 218 is not limited to tungsten silicide; rather, other conductive materials may be used as are known to those skilled in the art. In another exemplary embodiment, for example, the wordline conductor 218 comprises tungsten. A conductive material (not shown) may optionally be deposited to form a liner on the interior of the channel region 212 before deposition of the wordline conductor 218. The conductive liner, which may be comprised of tungsten nitride, for example, may protect the wordline conductor 218 from reacting with adjacent material during subsequent hot processing steps.

In an exemplary embodiment, an insulating spacer (not shown) may be formed coincident with the sidewall 222 of the trench before depositing the wordline conductor 218. The spacer may provide additional protection against a short between the wordline conductor 218 and the substrate 201. In this case, the wordline conductor 218 would be a predetermined distance away from alignment with the sidewall 222 of the trench.

In another exemplary embodiment (not shown), the etch through the STI region 228 and the etch through the gate conductor 216 extend to a depth near or below the top surface of the substrate 201. Shorts to the substrate 201 may then be prevented by depositing an insulator before depositing the wordline conductor 218. This embodiment may be used to increase the thickness of the wordline conductor 218 to reduce wordline conductor resistance.

As shown in FIG. 7, the sidewall 222 of the trench of DRAM cell 200 is a distance W from the sidewall 246 of the trench of an adjacent DRAM cell 230. The wordline conductor 218 corresponding to DRAM cell 200 has a sidewall 219 and the wordline conductor 232 of adjacent DRAM cell 230 has a sidewall 233. In this exemplary embodiment, the sidewalls 219, 233 of the wordline conductors 218, 232 are each aligned with the sidewalls 222, 246 of their respective trenches and are a distance W apart. In another exemplary embodiment (not shown), only one of the wordline conductors 218, 232 has its sidewall 219, 233 aligned with the sidewall 222, 246 of its respective trench. In another exemplary embodiment (not shown), one or more of the wordline conductors 218, 232 are spaced a predetermined thickness away from the sidewalls 222, 246 of their respective trenches.

After the wordline conductor 218 has been deposited, an oxide layer 240 is then deposited upon the wordline conductor 218, by chemical vapor deposition (CVD), for example. The oxide layer 240 is then planarized to the top surface of the pad nitride layer 226.

Figure 7B:
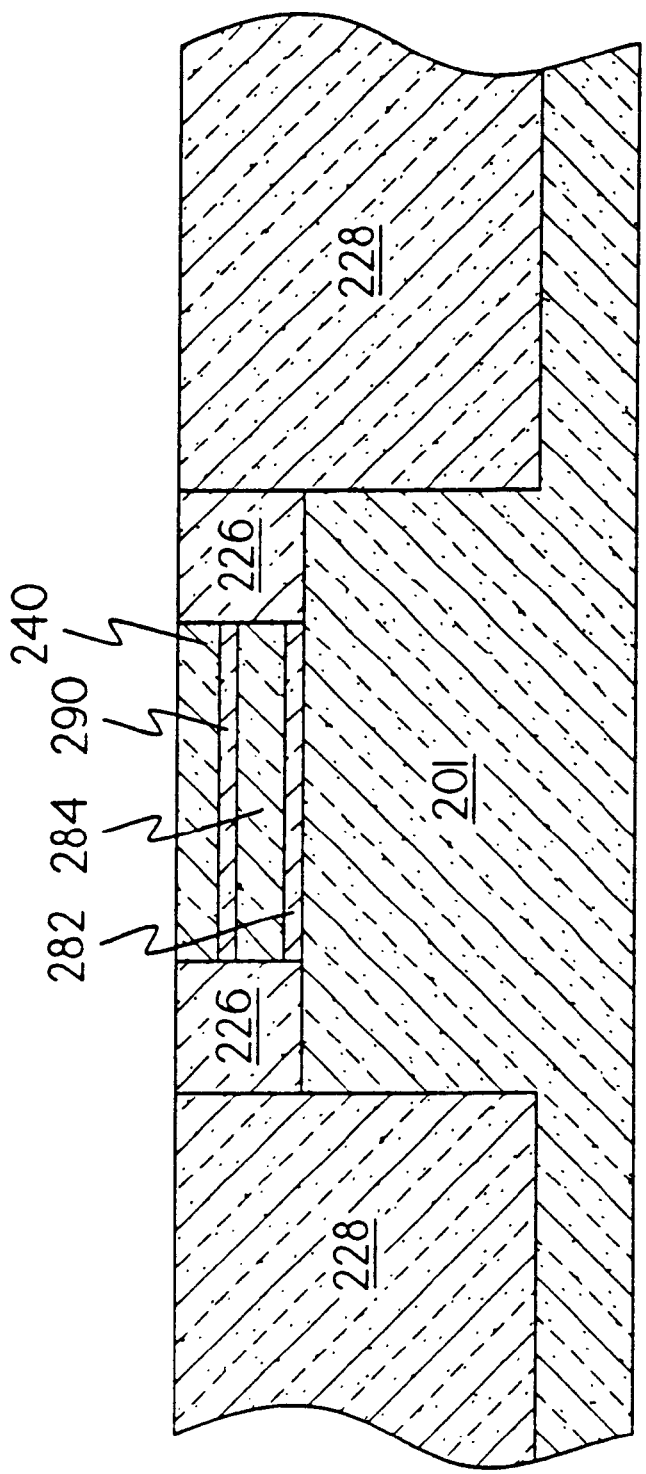
FIG. 7B is a partial cross-sectional view of support circuitry at a stage in processing corresponding to FIG. 7.

FIG. 7B is a partial cross-sectional view of support circuitry at a stage in processing corresponding to FIG. 7. As shown in FIG. 7B, the gate conductor wiring 290 is formed in the support region while the wordline conductors 218, 232 are formed in the array region.

Figure 8:
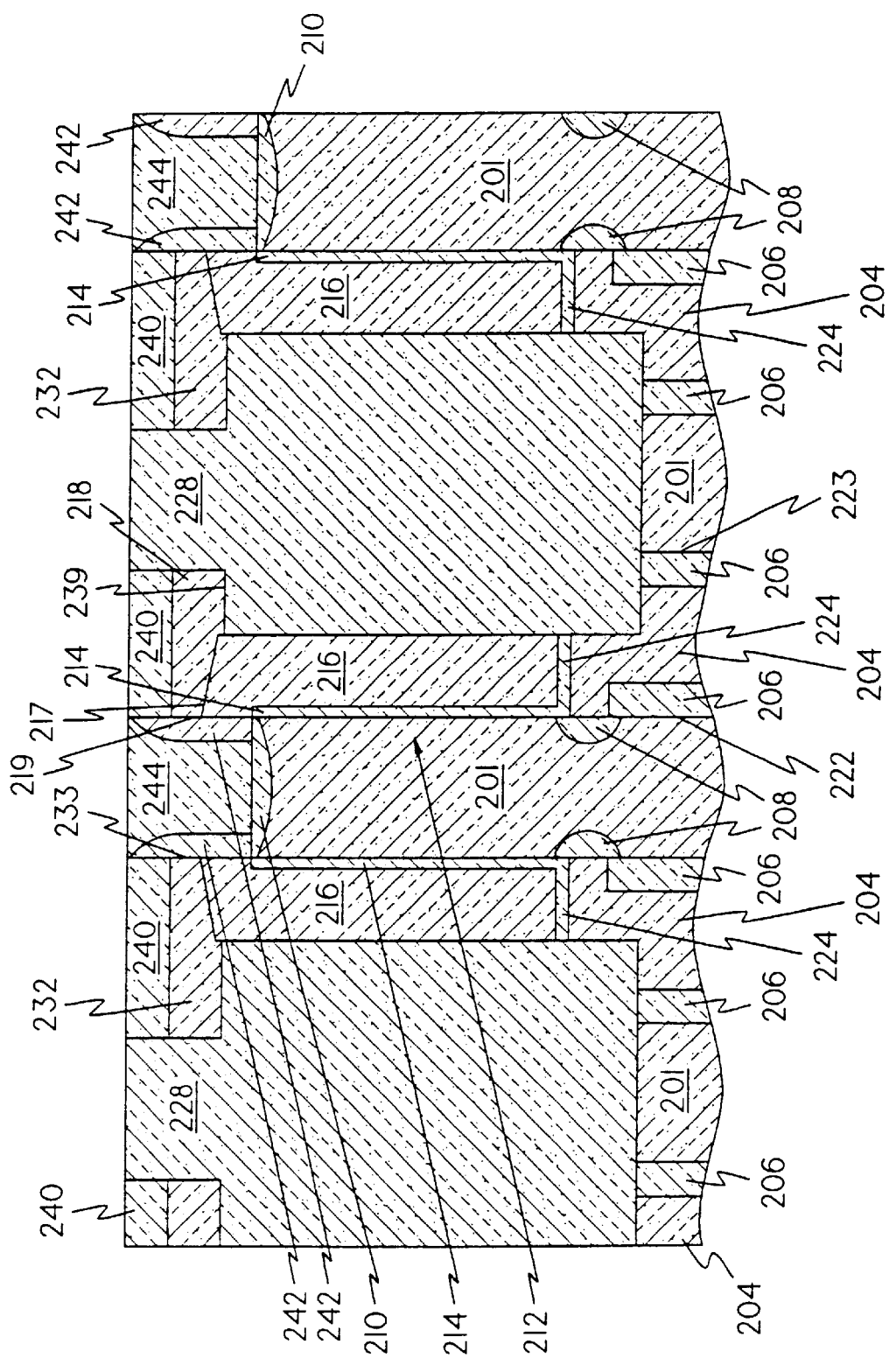

As shown in FIG. 8, the pad nitride layer 226 is then removed selective to the oxide of the STI region 228 and the oxide layer 240. A screen oxide layer (not shown) is then grown and array region p-well implants (not shown) are performed. An N+ dopant is then implanted to form the second diffusion region (bit line diffusion) 210.

Figure 8A:
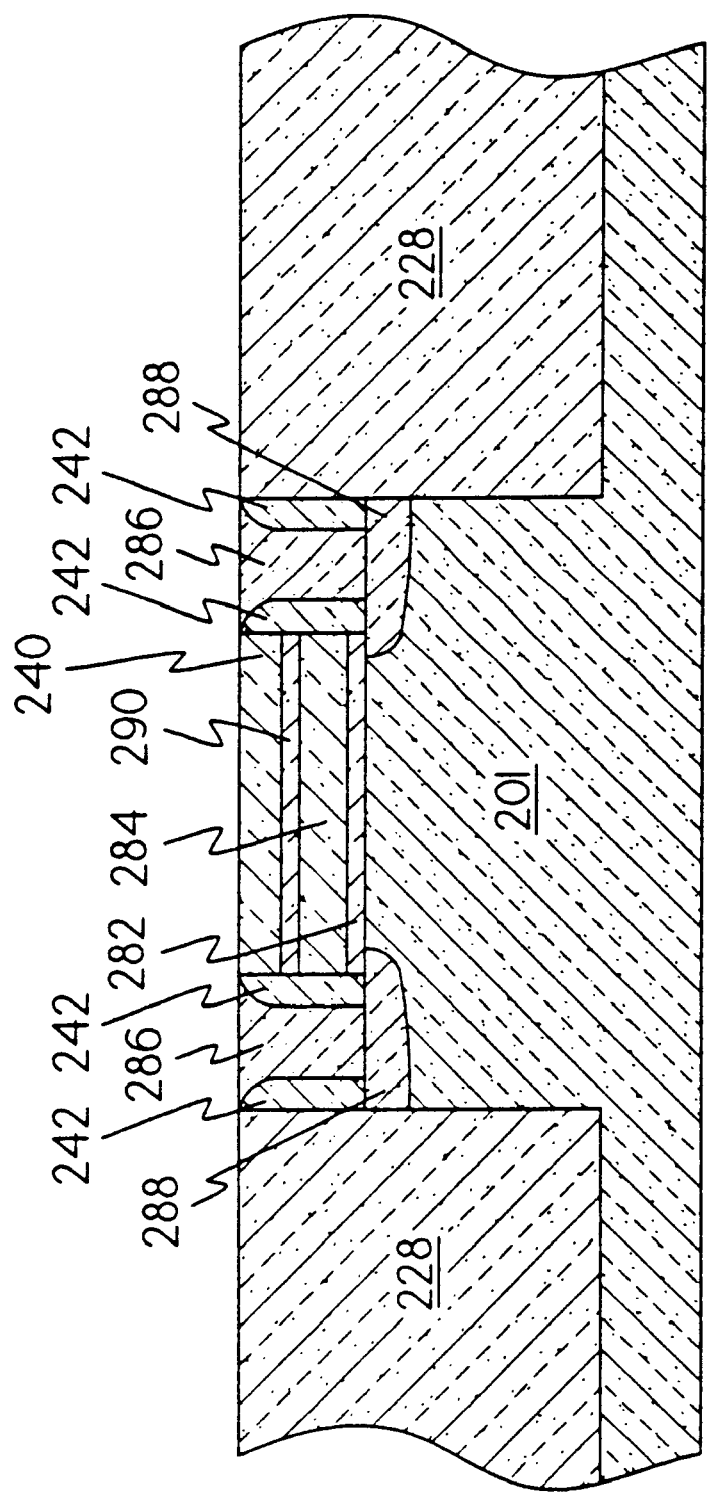
FIG. 8A is a partial cross-sectional view of support circuitry at a stage in processing corresponding to FIG. 8.

FIG. 8A is a partial cross-sectional view of support circuitry at a stage in processing corresponding to FIG. 8. Source and drain implants may then be performed in the support region to form diffusion regions 288 (FIG. 8A). Oxide spacers 242 are then formed on the sidewalls 219, 233 of the wordline conductors 218, 232 (FIG. 8) and on the sidewalls of the support gates (FIG. 8A). A bit line conductor 244 such as polysilicon is then deposited and planarized. The bit line conductor 244 may be removed from the support region in preparation for later formation of tungsten studs 286, or, alternatively, tungsten studs 286 may be used throughout instead of using a polysilicon bit line conductor 244 in the array region.

A process of manufacture according to the present invention provides a DRAM device having improved performance due to reduced wordline resistance. The RC delay of wordline gates most distant from a wordline driver rise more slowly than closer wordline gates. By decreasing the resistance of the wordline, the RC time constant seen by the wordline driver is reduced. This advantage allows the wordline voltage to rise more rapidly, resulting in improved performance by reducing the skew of rise time along the wordline. A process of manufacture according to the present invention has reduced sensitivity to wordline etching tolerances because the wordline is formed in a trench and because the trench etch through the gate conductor is selective to the gate insulator. This allows for a thicker and, therefore, lower-resistance wordline, if desired.

The present invention also allows the use of metal wordlines without the disadvantages associated with wordlines formed by subtractive etch processes. A subtractive etch to pattern a wordline stack is often followed by formation of a sidewall oxide to heal damage caused by the subtractive etch. Non-metal wordlines are often used to avoid problems associated with the reactivity of metal with the sidewall oxide.

In contrast, the wordline according to the present invention is formed in a channel etched into the STI region and into the gate conductor. Thus, a metal wordline may be used because the wordline is not patterned by a subtractive etch. Metal wordlines allow the resistance of the wordlines to be further reduced. In an exemplary embodiment of the present invention, a wordline has a resistance less than 1 ohm/square (where square is the cross-sectional distance of the wordline in the direction of current divided by the distance perpendicular to the current).

Metal wordlines may also be used to simultaneously reduce the resistance and capacitance of a wordline. The reduced resistance of a metal wordline allows a wordline to have a smaller sidewall area while still achieving a desired resistance. The smaller sidewall area reduces wordline capacitance between the wordline and a bit line stud, for example.

Although illustrated and described above with reference to certain specific embodiments, the present invention is nevertheless not intended to be limited to the details shown. Rather, various modifications may be made in the details within the scope and range of equivalents of the claims and without departing from the spirit of the invention.

What is claimed:

1. A process of manufacturing a vertical dynamic random access memory device comprising the steps of:
   (a) providing a substrate having a top surface;
   (b) etching a device trench into the substrate, the device trench having a sidewall, a lower portion, and an upper portion;
   (c) forming a signal storage node in the lower portion of the device trench, the signal storage node having a storage node conductor;
   (d) forming a signal transfer device in the upper portion of the device trench, the signal transfer device having a first diffusion region coupled to the storage node conductor and extending from the sidewall of the device trench into the substrate, a bit line diffusion region formed in the substrate adjacent to the top surface of the substrate and adjacent to the sidewall of the device trench, a channel region extending in the substrate from the first diffusion region to the bit line diffusion region, a gate insulator coating the sidewall of the device trench above the storage node conductor and adjacent the substrate, and a gate conductor filling the device trench;
   (e) coupling a bit line conductor to the bit line diffusion region;
   (f) self-aligning a wordline conductor formed upon the gate conductor with the sidewall of the device trench.

2. The process of manufacturing a dynamic random access memory device according to claim 1 further comprising the step of depositing a nitride layer upon the top surface of the substrate before step (b), and step (b) includes etching the device trench through the nitride layer and into the substrate, wherein step (d) includes forming the gate conductor by filling the device trench to a level above the top surface of the substrate and step (f) includes etching a wordline trench selective to nitride into the gate conductor and depositing the wordline conductor into the wordline trench.

3. The process of manufacturing a dynamic random access memory device according to claim 2 further comprising the step of forming an oxide layer upon the nitride layer and step (b) includes etching the device trench through the oxide layer, through the nitride layer, and into the substrate.

4. A process of manufacturing a vertical dynamic random access memory device comprising the steps of:
   (a) providing a substrate having a top surface;
   (b) depositing a nitride layer upon the top surface of the substrate;
   (c) etching a device trench into the substrate, the device trench having a sidewall, a lower portion, and an upper portion;
   (d) forming a signal storage node in the lower portion of the device trench, the signal storage node having a storage node conductor;
   (e) coating the storage node conductor with a trench-top insulator;
   (f) forming a signal transfer device in the upper portion of the device trench, the signal transfer device having a first diffusion region coupled to the storage node conductor and extending from the sidewall of the device trench into the substrate, a bit line diffusion region formed in the substrate adjacent to the top surface of the substrate and adjacent to the sidewall of the device trench, a channel region extending in the substrate from the first diffusion region to the bit line diffusion region, a gate insulator coating the sidewall of the device trench above the storage node conductor, and a gate conductor filling the device trench to a level above the top surface of the substrate;
   (g) depositing a photoresist;
   (h) patterning the photoresist to expose the gate conductor;
   (i) etching the gate conductor selective to nitride to form a wordline trench aligned with the sidewall of the device trench; and
   (j) depositing a wordline conductor in the wordline trench having a sidewall aligned with the sidewall of the device trench regardless of whether the photoresist is patterned in alignment with the sidewall of the device trench.

5. The process of manufacturing a dynamic random access memory device according to claim 4 further comprising the step of forming an oxide layer upon the nitride layer and wherein step (c) includes etching the device trench through the oxide layer, through the nitride layer, and into the substrate.

* * * * *